(12) United States Patent
Hikasa

(10) Patent No.: US 10,818,784 B2
(45) Date of Patent: Oct. 27, 2020

(54) SEMICONDUCTOR DEVICE AND METHOD FOR MANUFACTURING THE SAME

(71) Applicant: ROHM CO., LTD., Kyoto-shi, Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/266,981

(22) Filed: Feb. 4, 2019

(65) Prior Publication Data

US 2019/0172936 A1 Jun. 6, 2019

Related U.S. Application Data

(63) Continuation of application No. 15/457,289, filed on Mar. 13, 2017, now Pat. No. 10,236,368.

(30) Foreign Application Priority Data

Mar. 28, 2016 (JP) ................................. 2016-064106

(51) Int. Cl.
*H01L 29/739* (2006.01)
*H01L 29/10* (2006.01)
(Continued)

(52) U.S. Cl.
CPC ...... *H01L 29/7397* (2013.01); *H01L 29/0619* (2013.01); *H01L 29/0638* (2013.01);
(Continued)

(58) Field of Classification Search
CPC ............. H01L 29/1095; H01L 29/7397; H01L 29/0696; H01L 29/4236; H01L 29/0878;
(Continued)

(56) References Cited

U.S. PATENT DOCUMENTS

2012/0289003 A1\* 11/2012 Hirler ............... H01L 29/42304
438/138
2015/0270378 A1 9/2015 Konishi et al.
(Continued)

FOREIGN PATENT DOCUMENTS

JP 2004342863 12/2004
JP 2005057049 3/2005
(Continued)

OTHER PUBLICATIONS

Translation of J P2012-256628 A (Dec. 27, 2012). (Year: 2012).\*
(Continued)

*Primary Examiner* — Caridad Everhart
(74) *Attorney, Agent, or Firm* — Hamre, Schumann, Mueller & Larson, P.C.

(57) ABSTRACT

A semiconductor device according to the present invention includes a channel region of a first conductivity type, disposed at a front surface portion of a semiconductor layer, an emitter region of a second conductivity type, disposed at a front surface portion of the channel region, a drift region of the second conductivity type, disposed in the semiconductor layer at a rear surface side of the channel region, a collector region of the first conductivity type, disposed in the semiconductor layer at a rear surface side of the drift region, a gate trench, formed in the semiconductor layer, a gate electrode, embedded in the gate trench, and a convex region of the second conductivity type, projecting selectively from the drift region to the channel region side at a position separated from a side surface of the gate trench.

14 Claims, 17 Drawing Sheets

(51) Int. Cl.
*H01L 29/66* (2006.01)
*H01L 29/06* (2006.01)
*H01L 29/423* (2006.01)
*H01L 29/40* (2006.01)
*H01L 29/08* (2006.01)

(52) U.S. Cl.
CPC ...... *H01L 29/0696* (2013.01); *H01L 29/1037* (2013.01); *H01L 29/1095* (2013.01); *H01L 29/402* (2013.01); *H01L 29/4238* (2013.01); *H01L 29/6634* (2013.01); *H01L 29/66348* (2013.01); *H01L 29/083* (2013.01); *H01L 29/7396* (2013.01)

(58) Field of Classification Search
CPC ..... H01L 29/36; H01L 29/063; H01L 29/401; H01L 29/086; H01L 29/66348; H01L 29/0638; H01L 29/083; H01L 29/1037
See application file for complete search history.

(56) References Cited

U.S. PATENT DOCUMENTS

2015/0349115 A1* 12/2015 Tega ................... H01L 29/7813
257/77
2017/0012551 A1 1/2017 Kondo et al.

FOREIGN PATENT DOCUMENTS

| JP | 2007311557 | | 11/2007 | |
|---|---|---|---|---|
| JP | 2008177297 A | | 7/2008 | |
| JP | 2012191053 | | 10/2012 | |
| JP | 2012256628 | * | 12/2012 | ......... H01L 29/1095 |
| JP | 2014075483 | | 4/2014 | |
| JP | 2015179707 A | | 10/2015 | |
| WO | 2013046378 | | 4/2013 | |

OTHER PUBLICATIONS

Office Action issued for Japanese Patent Application No. 2016-064106, Dispatch Date: Nov. 14, 2019, 13 pages including English machine translation.

* cited by examiner

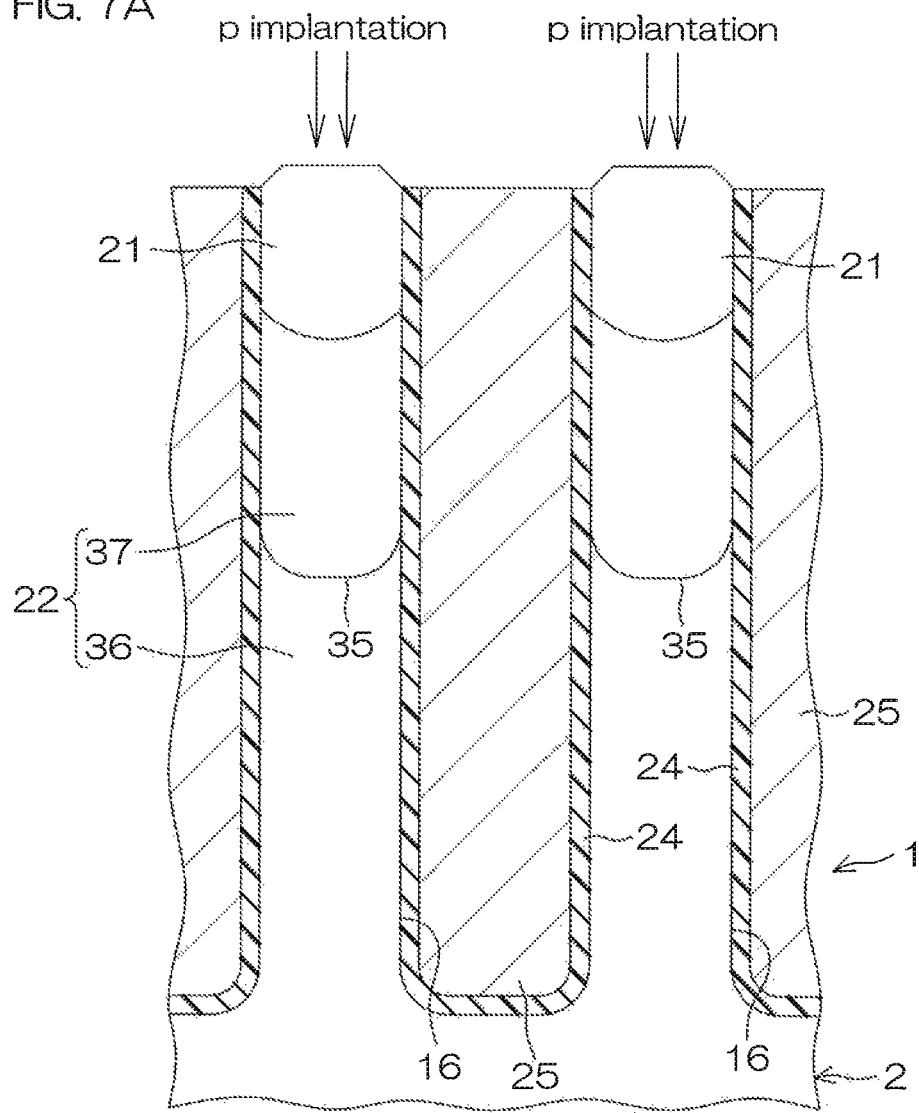

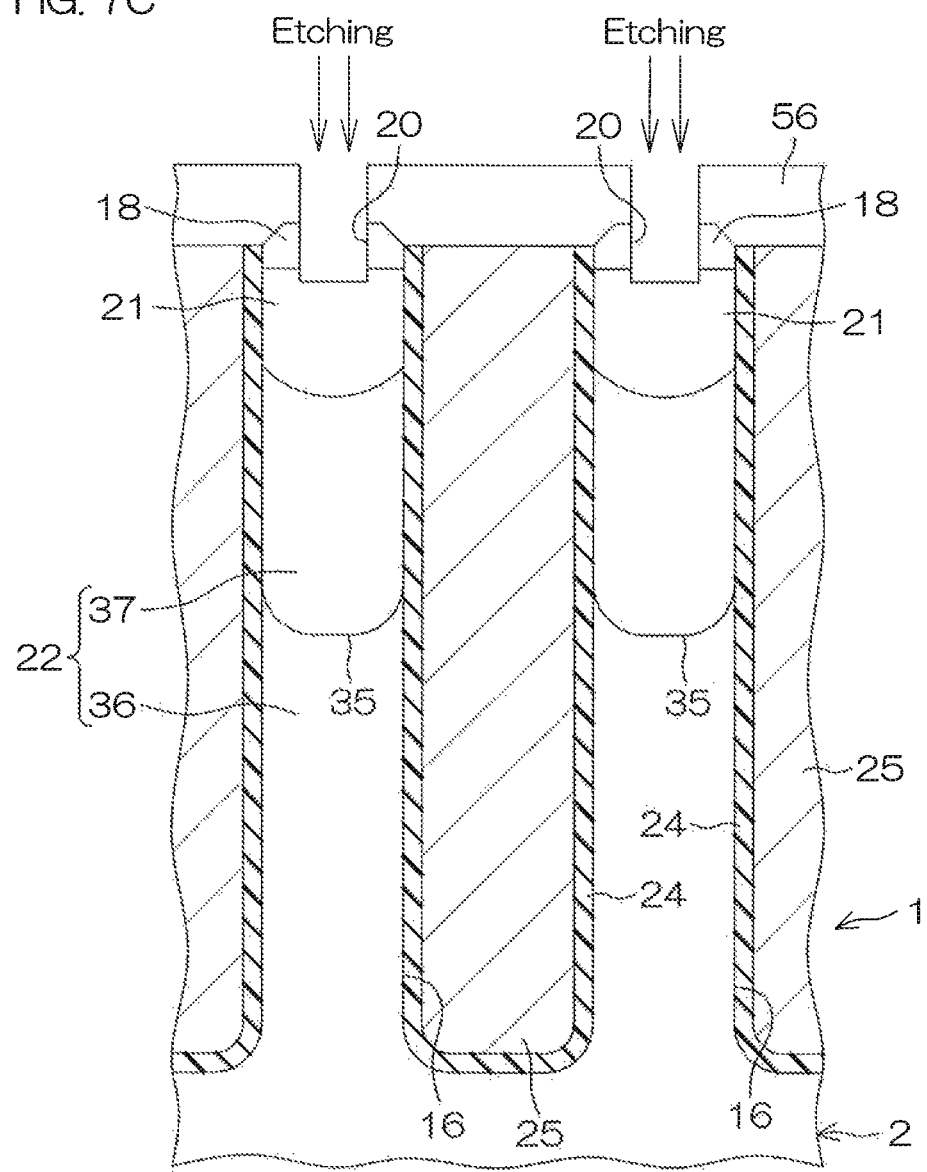

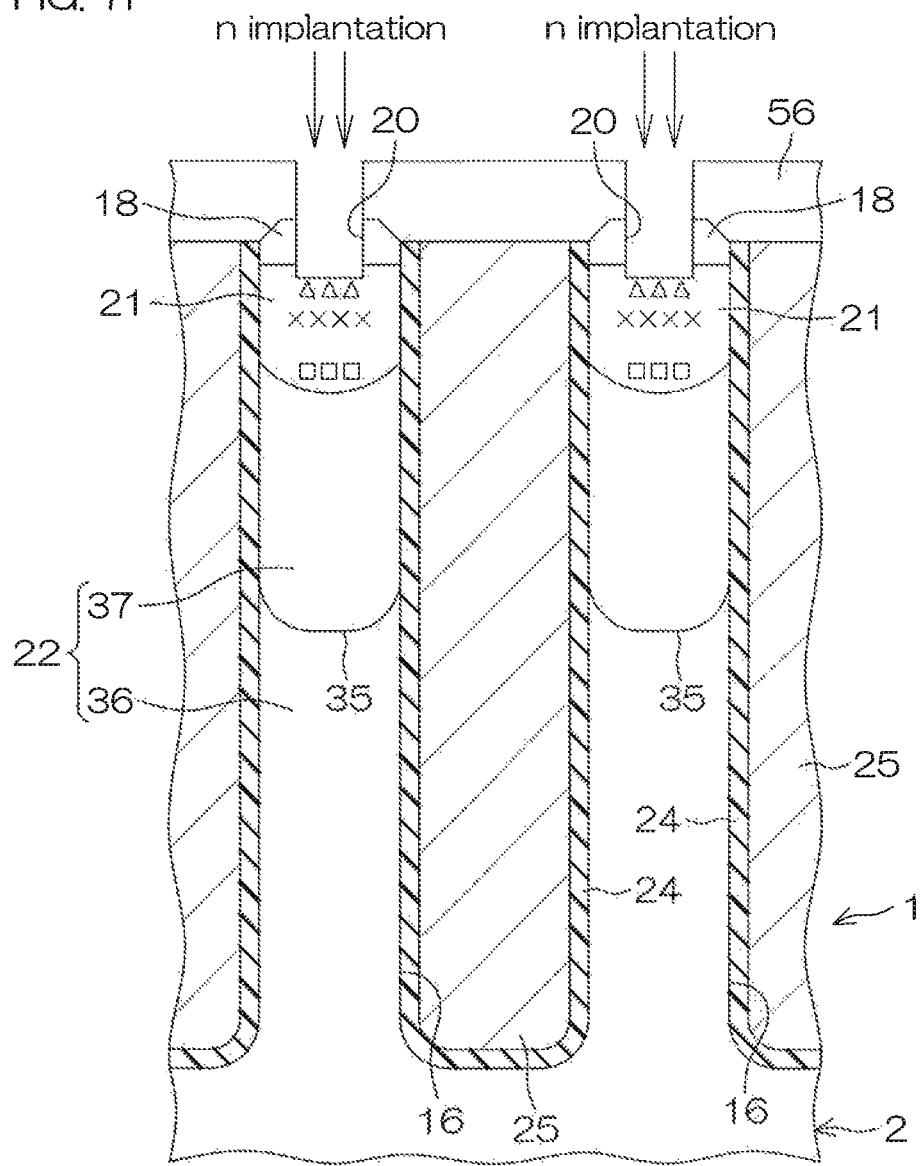

VCE-IC@Tj=175°C

VCE-IC@Tj=175°C

Turn-on waveforms@Tj=175°C

Turn-off waveforms@Tj=175°C

SEMICONDUCTOR DEVICE AND METHOD FOR MANUFACTURING THE SAME

CROSS-REFERENCE TO RELATED APPLICATIONS

The present application corresponds to Japanese Patent Application No. 2016-64106 filed in the Japan Patent Office on Mar. 28, 2016, and the entire disclosure of this application is incorporated herein by reference.

TECHNICAL FIELD

The present invention relates to a semiconductor device, which includes a trench gate type IGBT (Insulated Gate Bipolar Transistor), and a method for manufacturing the same.

BACKGROUND ART

As a known IGBT structure, for example, Japanese Patent Application Publication No. 2008-177297 discloses a semiconductor device including an upper drift region, separated from an n type emitter region by a p type body region, a p type floating semiconductor region, formed therebelow and being in an electrically floated state, an n type lower drift region, formed therebelow and being electrically continuous with the upper drift region, a trench, extending from a front surface of the emitter region so as to penetrate through the body region and the upper drift region and having its bottom surface projecting to the lower drift region, and a trench gate electrode, accommodated inside the trench in a state of being surrounded by an insulating layer covering its inner surface.

SUMMARY OF INVENTION

It is considered that if as characteristics of an IGBT, both suppression of latch-up and reduction of On-voltage can be achieved without increasing switching loss, a semiconductor device of higher performance than the conventional art can be provided. However, measures capable of realizing such characteristics have not been proposed until now.

A preferred embodiment of the present invention thus provides a semiconductor device, with which both suppression of latch-up and reduction of On-voltage can be achieved without increasing switching loss, and a method for manufacturing the same.

BRIEF DESCRIPTION OF DRAWINGS

FIG. 7A to FIG. 7G are diagrams of processes related to the forming an impurity region of an IGBT.

DESCRIPTION OF EMBODIMENTS

Figure 1:
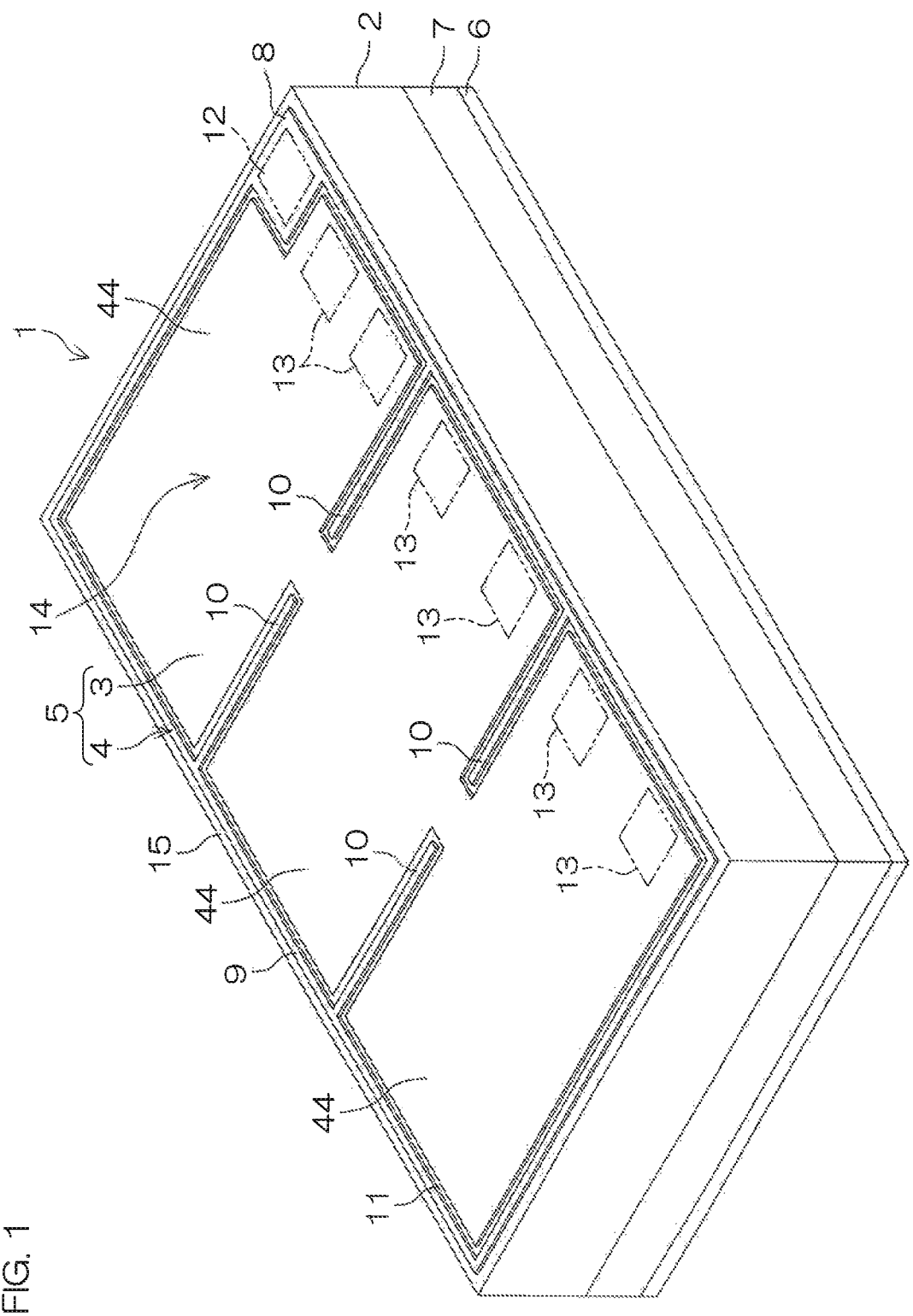
FIG. 1 is a schematic perspective view of a semiconductor device according to a preferred embodiment of the present invention.

A semiconductor device according to a preferred embodiment of the present invention includes a semiconductor layer, a channel region of a first conductivity type, disposed at a front surface portion of the semiconductor layer, an emitter region of a second conductivity type, disposed at a front surface portion of the channel region, a drift region of the second conductivity type, disposed in the semiconductor layer at a rear surface side of the channel region, a collector region of the first conductivity type, disposed in the semiconductor layer at a rear surface side of the drift region, a gate trench, passing through the emitter region and the channel region from a front surface of the semiconductor layer and reaching the drift region, a gate electrode, embedded in the gate trench, and a convex region of the second conductivity type, projecting selectively from the drift region to the channel region side at a position separated from a side surface of the gate trench.

With the present arrangement, a distance between the emitter region and the drift region of the second conductivity type that face each other across the channel region of the first conductivity type can be shortened by the forming of the convex region. A serial resistance component when supplying carriers (electrons or positive holes) from the emitter region to the drift region can thereby be reduced and conductivity modulation in an IGBT can thereby be made to occur efficiently. Consequently, reduction of On-voltage can be achieved.

Also, the convex region is formed to avoid the side surface of the gate trench in which a channel is formed during operation of the IGBT, a channel length in the channel region does not have to be changed. Minority carriers (electrons or positive holes) within the drift region can thereby be suppressed from being absorbed by the emitter region when the IGBT transitions to an off state. Consequently, occurrence of latch-up can be suppressed.

With the present semiconductor device, the above-described suppression of latch-up and reduction of On-voltage can both be achieved without increasing switching loss.

Also, a method for manufacturing a semiconductor device according to a preferred embodiment of the present invention includes a process of preparing a semiconductor layer having a channel region of a first conductivity type, an emitter region of a second conductivity type, disposed at a front surface portion of the channel region, and a drift region of the second conductivity type, disposed at a rear surface side of the channel region, and having a gate trench passing through the emitter region and the channel region from a front surface of the semiconductor layer and reaching the drift region, a process of embedding a gate electrode in the gate trench, a process of selectively implanting an impurity of the second conductivity type into a bottom portion of the channel region to form a convex region projecting selectively from the drift region to the channel region side at a position separated from a side surface of the gate trench, and a process of forming a collector region of the first conductivity type in the semiconductor layer at a rear surface side of the drift region.

The semiconductor device according to the preferred embodiment of the present invention can be manufactured by the present method.

A preferred embodiment of the present invention shall now be described in detail with reference to the attached drawings.

Figure 2:
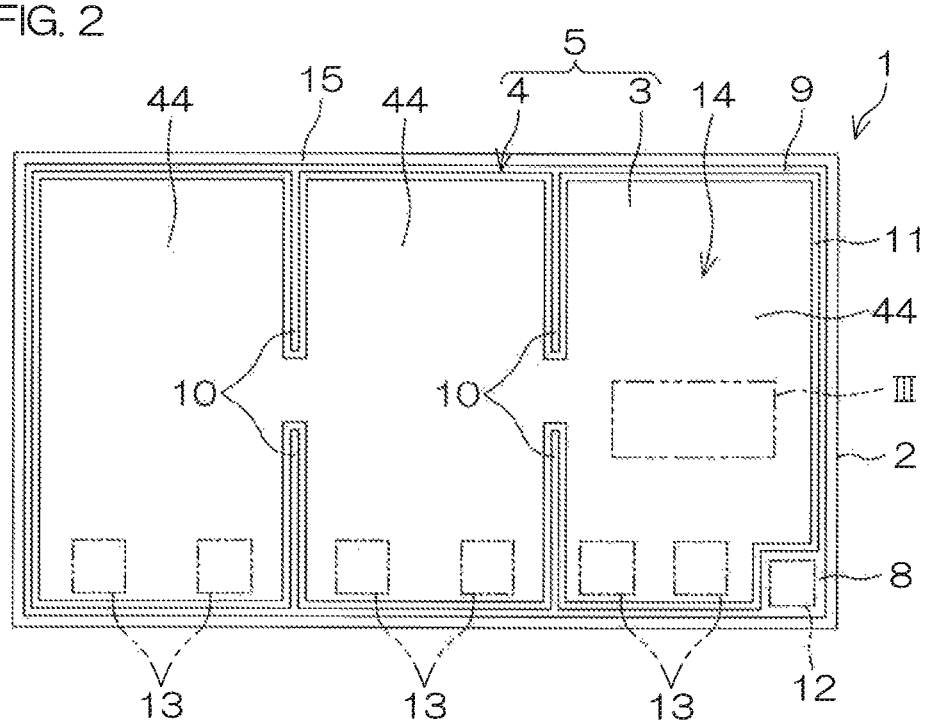
FIG. 2 is a schematic plan view of the semiconductor device.

FIG. 1 is a schematic perspective view of a semiconductor device 1 according to a preferred embodiment of the present invention. Also, FIG. 2 is a schematic plan view of the semiconductor device 1.

The semiconductor device 1 has a basic form of a trench gate type IGBT (Insulated Gate Bipolar Transistor).

The semiconductor device 1 includes an n⁻ type semiconductor layer 2. In the present preferred embodiment, the semiconductor layer 2 is a silicon monocrystalline substrate formed using a semiconductor wafer of an n⁻ type silicon (Si) monocrystal manufactured by an FZ (Floating Zone) method. The n⁻ type impurity concentration of the semiconductor layer 2 may, for example, be $4 \times 10^{13}$ cm$^{-3}$ to $1 \times 10^{15}$ cm$^{-3}$.

An electrode film 5, including an emitter electrode 3 and a gate electrode 4, is formed on the semiconductor layer 2. A collector electrode 6 is formed on substantially the entirety of a rear surface of the semiconductor layer 2. The collector electrode 6 is connected to a p⁺ type collector region 7 formed at the rear surface of the semiconductor layer 2. The semiconductor layer 2 is formed, for example, to be rectangular in plan view, and accordingly, the semiconductor device 1 has a rectangular shape in plan view.

The electrode film 5 is formed in a rectangular region extending across substantially an entirety of a front surface of the semiconductor layer 2. The gate electrode 4 includes a pad electrode portion 8, formed at one corner portion of the semiconductor device 1, an outer peripheral electrode portion 9, formed along an entire perimeter of an outer peripheral portion of the front surface of the semiconductor device 1, and a plurality (four, in the present preferred embodiment) of gate finger portions 10, extending from the outer peripheral electrode portion 9 to an inner region of the front surface of the semiconductor device 1. The front surface of the semiconductor device 1 has an oblong shape having a pair of short sides and a pair of long sides joining the short sides and accordingly, the outer peripheral electrode portion 9 is formed to an oblong annular shape. Two of the gate finger portions 10 are formed across an interval so as to extend parallel to each other from each of the pair of long side portions of the outer peripheral electrode portion 9.

The emitter electrode 3 is formed in a state of being insulated from the gate electrode 4 in the inner region surrounded by the outer peripheral electrode portion 9. The emitter electrode 3 is formed so as to cover substantially an entirety of the semiconductor layer 2 in a region surrounded by the gate electrode 4 and between the emitter electrode 3 and the gate electrode 4 is formed a separating region 11 that insulates the two.

A front surface protection film (the front surface protection film 45 of FIG. 5) is formed so as to cover the emitter electrode 3, the gate electrode 4, and the front surface of the semiconductor layer 2 exposed from the two. As indicated by alternate long and two short dashes lines in FIG. 1 and FIG. 2, a gate pad opening 12 and emitter pad openings 13 are formed in the front surface protection film. The gate pad opening 12 is formed so as to expose a portion of the pad electrode portion 8. Each emitter pad opening 13 is formed to expose a portion of a front surface of the emitter electrode 3. In the present preferred embodiment, a plurality (for example, six) of the emitter pad openings 13 are aligned along one long side of the rectangular front surface of the semiconductor device 1.

In the present preferred embodiment, the semiconductor layer 2 is demarcated by the gate finger portions 10 as boundaries into a more inward active region 14 and a more outward outer peripheral region 15. As shall be described below, the active region 14 is mainly a region in which unit cells of the IGBT are formed and the outer peripheral region is mainly a region in which a voltage withstanding structure of the IGBT is formed.

Figure 3:
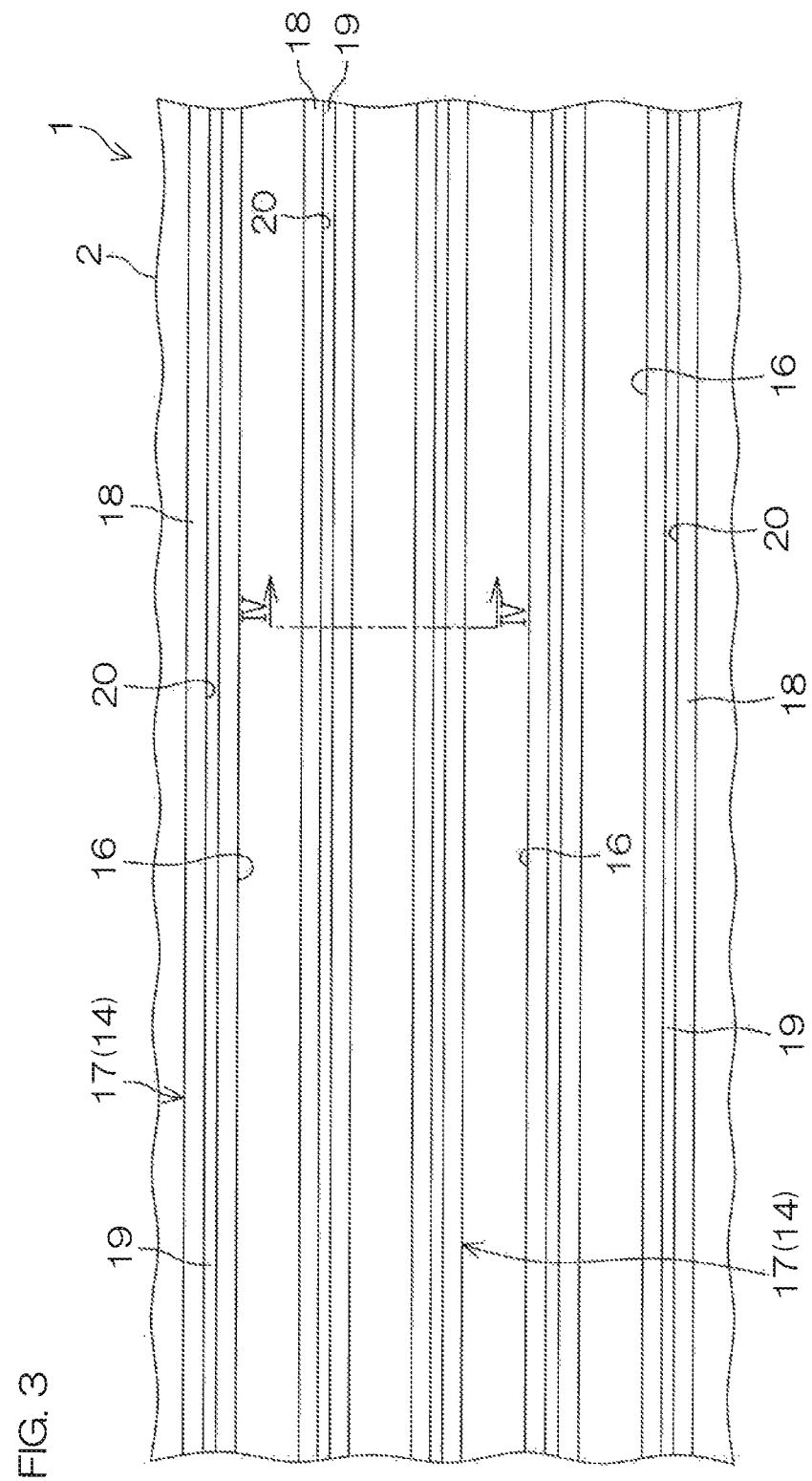
FIG. 3 is a partially enlarged plan view of the structure of a semiconductor layer of the semiconductor device and shows the structure in a region III of FIG. 2.

FIG. 3 is a partially enlarged plan view of the structure of the front surface of the semiconductor layer 2 in a state where the electrode film 5 is removed and shows the structure in a region III of FIG. 2.

Gate trenches 16 are formed in the semiconductor layer 2. In the present preferred embodiment, a plurality of the gate trenches 16 are formed in stripes. Each gate trench 16 is formed rectilinearly along the front surface of the semiconductor layer 2 and the plurality of gate trenches 16 are formed at equal intervals in parallel to each other.

The semiconductor layer 2, that is, active portions 17 of the active region 14 are exposed between adjacent gate trenches 2. Each of the active portions 17 includes an n⁺ type emitter region 18 and a p⁺ type channel contact region 19.

The n⁺ type emitter regions 18 are formed in stripes along the gate trenches 16. A contact trench 20 is formed at a central portion in a width direction (direction intersecting a length direction) of each n⁺ type emitter region 18 and a p⁺ type channel contact region 19 is formed at a bottom portion of the contact trench 20. The contact trench 20 and the p⁺ type channel contact region 19 do not need to be formed across an entire length of the n⁺ type emitter region 18. For example, a plurality of contact trenches 20, each having a fixed length in the direction along the gate trench 16, may be formed and a p⁺ type channel contact region 19 may be formed dispersedly in each individual contact trench 20. That is, a plurality of the p⁺ type channel contact region 19 may be formed at equal intervals in a length direction of the gate trench 16 so as to be interposed between n⁺ type emitter regions 18, each of fixed length.

Figure 4:
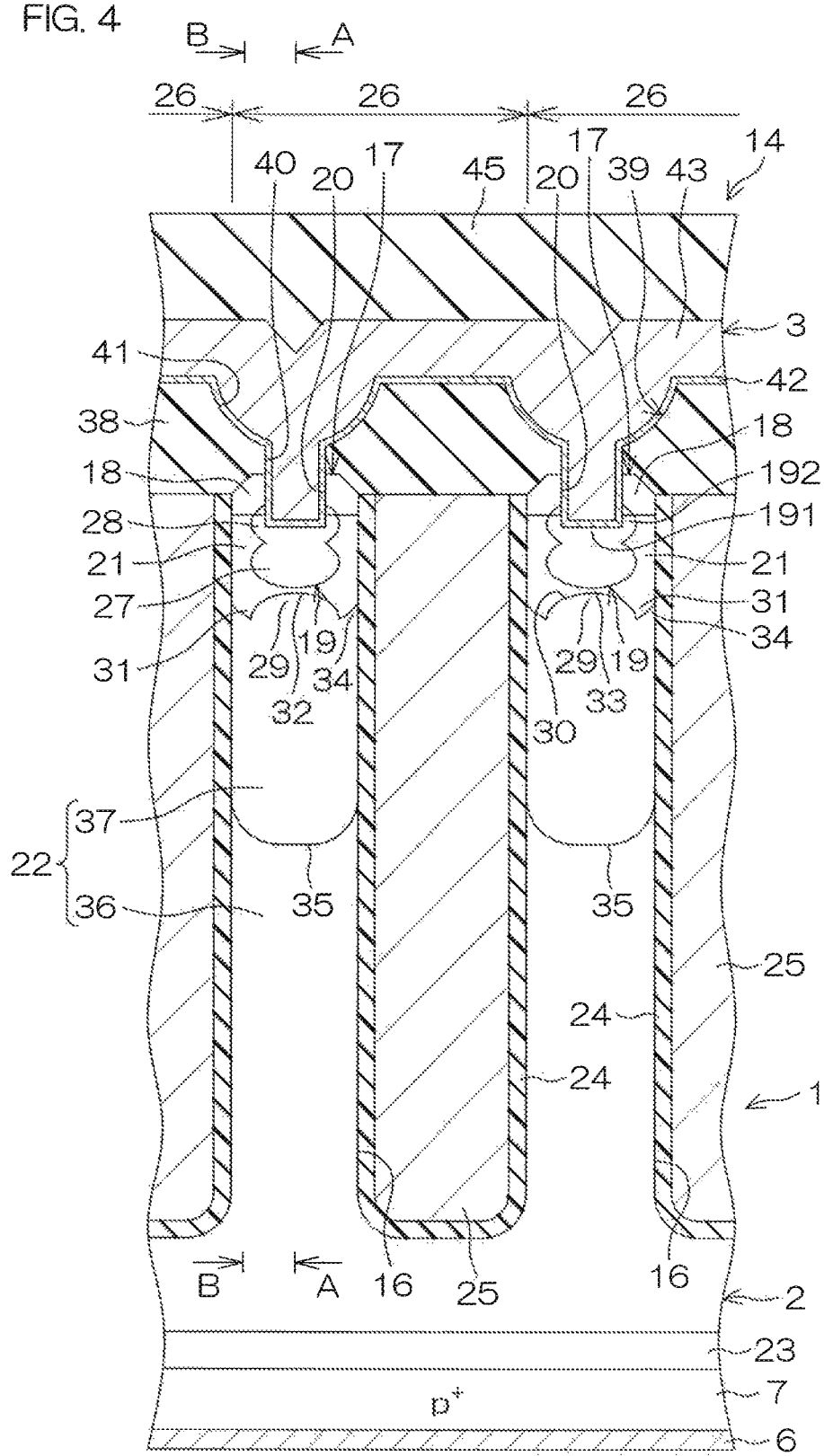
FIG. 4 is a sectional view taken along section plane IV-IV of FIG. 3.

FIG. 4 is a sectional view taken along section plane IV-IV of FIG. 3. The cross-sectional structure of the active region 14 of the semiconductor device 1 shall now be described with reference to FIG. 4.

As shown in FIG. 4, the semiconductor layer 2 has disposed, successively along its thickness direction from the semiconductor device 1 front surface side, the n⁺ type emitter regions 18, p type channel regions 21, an n⁻ type drift region 22, an n type semiconductor region 23, and the p⁺ type collector region 7.

Each gate trench 16 is formed by digging from the front surface of the semiconductor layer 2 in a substantially rectangular cross-sectional shape. The plurality of gate trenches 16 are formed in parallel at a fixed pitch along a direction parallel to a major surface of the semiconductor layer 2. The plurality of gate trenches 16 have, for example, mutually equal widths. The respective gate trenches 16 are formed to a depth of penetrating through the n⁺ type emitter regions 18 and the p type channel regions 21 and reaching intermediate portions of the n⁻ type drift region 22. In the present preferred embodiment, each gate trench 16 is formed so that its section plane intersecting its length direction is substantially rectangular.

An inner wall surface of each gate trench 16 is covered by a gate insulating film 24. The gate insulating film 24 is constituted of an insulating material, for example, $SiO_2$, etc. The gate insulating film 24 is formed so as to cover a bottom surface and side walls of the gate trench 16. Inside the gate trench 16, a polysilicon gate 25 is embedded as a gate conductor so as to contact the gate insulating film 24. The polysilicon gate 25 is embedded in the gate trench 16.

Via the gate insulating film 24, the polysilicon gate 25 faces a lower portion of the n⁺ type emitter region 18, the p type channel region 21, and the n⁻ type drift region 22. That is, in regard to a thickness direction of the semiconductor layer 2, the polysilicon film 25 is formed to face the p type channel region 21 entirely via the gate insulating film 24.

Each active portion 17, which operates as a transistor, is formed by the semiconductor layer 2 between adjacent gate trenches 16. For example, it may be deemed that the polysilicon gate 25 inside one gate trench 16 and the active portion 17 adjacent to one side thereof form a unit cell 26. That is, the unit cell 26 constitutes a repeated unit that is repeated at the formation pitch of the gate trench 16. In other words, a plurality of the unit cells 26 are aligned at equal intervals in a direction (a direction parallel to the major surface of the semiconductor layer 2) that is orthogonal to the length direction and the depth direction of the respective gate trenches 16.

The contact trenches 20 are formed along the length direction of the gate trenches 16 at front surface portions of the active portions 17. Each contact trench 20 is formed by digging from the front surface of the semiconductor layer 2 in a substantially rectangular cross-sectional shape. The respective contact trenches 20 are formed to a depth of penetrating through the n⁺ type emitter regions 18 and reaching intermediate portions of the p type channel regions 21. In the present preferred embodiment, each contact trench 20 is formed so that its section plane intersecting its length direction is substantially rectangular.

Bottom portions of the contact trenches 20 are covered by the p⁺ type channel contact regions 19. The p⁺ type channel contact regions 19 are p type semiconductor regions that are formed to be of higher concentration than the p type channel regions 21. The impurity concentration of the p type channel regions 21 may, for example, be approximately $5 \times 10^{15}$ $cm^{-3}$ to $5 \times 10^{17}$ $cm^{-3}$.

Each p⁺ type channel contact region 19 is formed to spread to sides of the corresponding contact trench 20 and includes a first portion 191, covering a bottom surface of the contact trench 20, and second portions 192, covering lower portions of side surfaces of the contact trench 20.

Also, each p⁺ type channel contact region 19 has a two-step structure of a first contact region 27, disposed at the semiconductor layer 2 rear surface side, and a second contact region 28, disposed on the first contact region 27 and being of lower concentration than the first contact region 27. Also, the first contact region 27 may be formed to be thicker than the second contact region 28. In the present preferred embodiment, the second contact region 28 constitutes the first portion 191 and the second portions 192 of the p⁺ type channel contact region 19.

In the semiconductor device 1, an n⁺ type convex region 29 is formed at a boundary portion between each p type channel region 21 and the n⁻ type drift region 22. The n⁺ type convex region 29 is formed in continuation to the n⁻ type drift region 22 and projects selectively from the n⁻ type drift region 22 to the p type channel region 21 side (the semiconductor layer 2 front surface side) at a position separated from side surfaces of the gate trenches 16. More specifically, immediately below the p⁺ type channel contact region 19, a width-direction central portion of the n⁻ type drift region 22 between adjacent gate trenches 16 is formed so as to bulge in a dome form having a curved surface 30 that faces the p⁺ type channel contact region 19. Between the p⁺ type channel contact region 19 and the n⁺ type convex region 29, a separating region 33, constituted of a portion of the p type channel region 21, is formed to separate the two regions. The n⁺ type convex region 29 faces the p⁺ type channel contact region 19 via the separating region 33. Also, the n⁺ type convex region 29 may have a higher impurity concentration than the p type channel region 21 and the n⁻ type drift region 22. For example, the impurity of concentration of the n⁺ type convex region 29 may be approximately $5 \times 10^{15}$ $cm^{-3}$ to $1 \times 10^{18}$ $cm^{-3}$.

By the intrusion of the n⁺ type convex region 29, a bottom portion of the p type channel region 21 is converted to the n type and notably, the p type portion has its lower surface side formed to an open concave shape with side portions 31 wrapping around a periphery of the n⁺ type convex region 29. That is, the p type channel region 21 has a concave surface 32 at a boundary portion with the n⁺ type convex region 29. The side portions 31 of the p type channel region 21 are portions situated along the side surfaces of gate trenches 16 and an inversion layer (channel) is formed when a voltage of not less than a threshold value is applied to the polysilicon gate 25.

Lower portions of the side portions 31 of the p type channel region 21 are separated by gaps from the side surfaces of the gate trenches 16, and portions of the n⁻ type drift region 22 enter into these gaps as n⁻ type end portions 34. Although the n⁻ type end portions 34 project toward the semiconductor layer 22 front surface side like the n⁺ type convex region 29, projection amounts thereof are smaller than that of the n⁺ type convex region 29. A tip of the n⁺ type convex region 29 is thus disposed further to the semiconductor layer 2 front surface side than upper ends of the n⁻ type end portions 34.

Also with the present preferred embodiment, the n⁻ type drift region 22 has boundaries 35 that demarcate the n⁻ type drift region 22 into two types of regions at intermediate portions in the depth direction of the gate trenches 16. The two types of regions include a first drift region 36, disposed further toward bottom portions of the gate trenches 16 than the boundaries 35, and second drift regions 37, disposed at opposite sides of the first drift regions 36. More specifically, the second drift regions 37, of higher concentration than the first drift region 36, are formed in well shapes at front surface portions of the first drift region 36 that serves as a base portion inheriting the impurity concentration of the semiconductor layer 2. For example, the impurity concentration of the first drift region 36 may be $4 \times 10^{13}$ $cm^{-3}$ to $1 \times 10^{15}$ $cm^{-3}$ and equivalent to the impurity concentration of the semiconductor layer 2 as mentioned above. Thereabove, the n⁺ type convex regions 29 are formed in continuation to the second drift regions 37 and the second drift regions 37 contact the p type channel regions 21 as the n⁻ type end portions 34.

The n type semiconductor region 23 may also be referred to, for example, as an n type buffer region or an n type field stop region. Such regions may be provided in plurality. For example, an n type field stop region may be formed so as to contact the p+ type collector region 7 and an n type buffer region may be formed thereon.

An interlayer insulating film 38 is formed so as to cover the front surface of the semiconductor layer 2. The interlayer insulating film 38 is constituted, for example, of an insulating material, such as the $SiO_2$, etc. Contact holes 39, continuing to the contact trenches 20, are formed in the interlayer insulating film 38. Each contact hole 39 includes a lower portion 40, of the same width as each contact trench 20, and an upper portion 41 (tapered portion) that widens in width toward an upper side from an upper end of the lower portion 40.

The emitter electrode 3 is disposed on the interlayer insulating film 38. The emitter electrode 3 is constituted of a laminated structure film, in which a barrier film 42 and an electrode main body film 43 are laminated. The barrier film 42 is constituted of a material having a barrier property of preventing a constituent material (for example, aluminum copper (AlCu) alloy) of the electrode main body film 43 from diffusing to the active portion 17 side, and having conductivity. The barrier film 42 may, for example, be a TiN film.

The electrode main body film 43 contacts the barrier film 42 and is formed to cover an upper surface of the barrier film 42. The electrode main body film 43 may be constituted, for example, of an AlCu alloy film.

The emitter electrode 3 is electrically connected to the n+ type emitter regions 18 and the p+ type channel contact regions 19. The n+ type emitter regions 18 and the p type channel regions 21 are therefore controlled to be of equal potential.

Also, contact holes are formed in the interlayer insulating film 38 at positions not shown in FIG. 4. The polysilicon gates 25 and the gate electrode 4 are electrically connected via the contact holes. More specifically, as shown in the plan view of FIG. 2, the front surface region of the semiconductor layer 2 is demarcated into a plurality (three, in the present preferred embodiment) of cell formation regions 44 by the outer peripheral electrode portion 9 and the gate finger portions 10. Each cell formation region 44 is a region of substantially oblong shape. The respective gate trenches 16 are formed to extend parallel to the pair of short sides of the oblong shape, and the plurality of gate trenches 16 are aligned at equal intervals along the pair of long sides of the oblong shape. Both ends of each gate trench 16 are electrically connected to the outer peripheral electrode portion 9 or the gate finger portions 10.

The front surface protection film 45 is formed so as to cover the emitter electrode 3. The front surface protection film 45 may be constituted, for example, of polyimide and may be formed, for example, by a spin coating method.

The collector electrode 6 may have a laminated structure of AlSi/Ti/Ni/Au laminated successively from the rear surface of the semiconductor layer 2.

Figure 5:
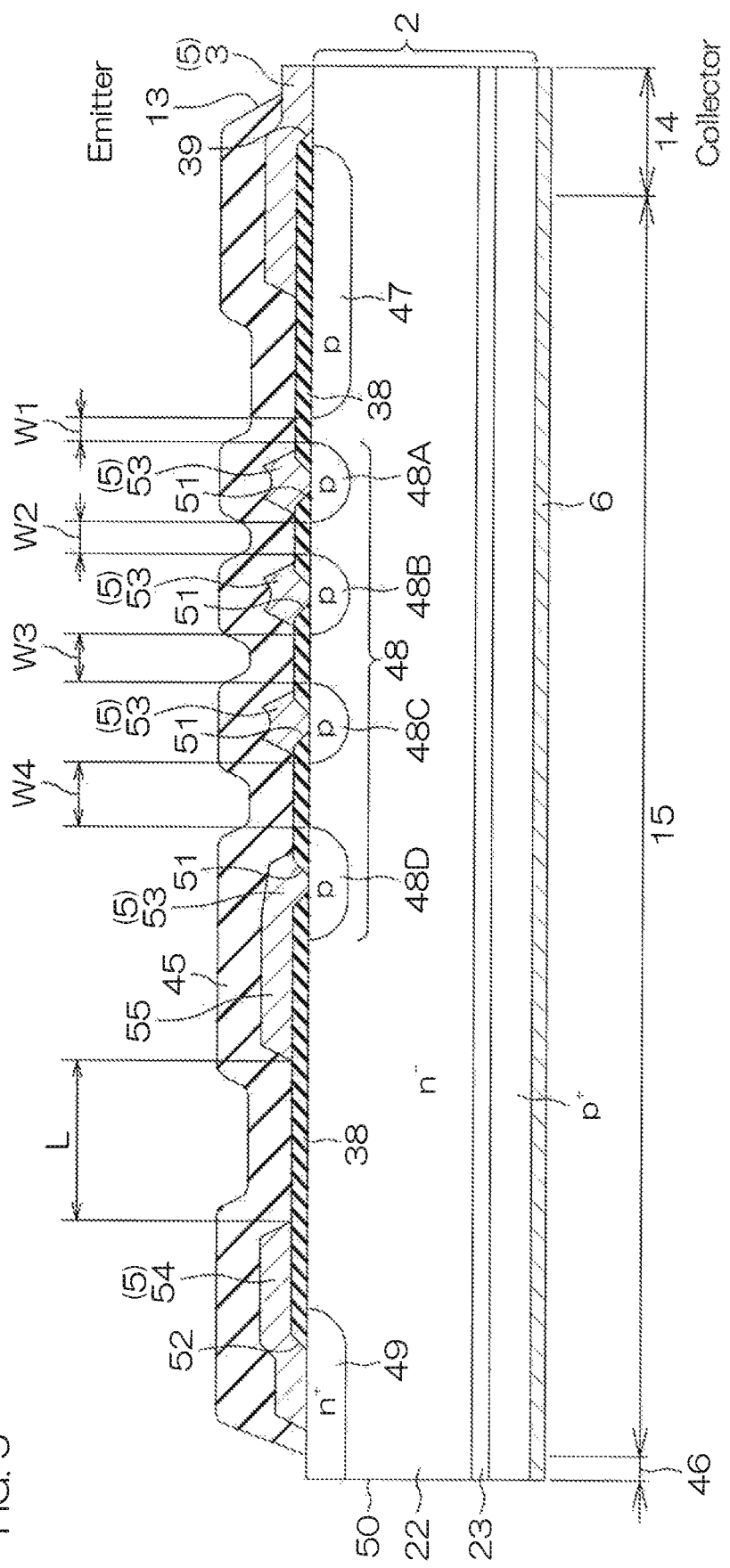
FIG. 5 is a schematic sectional view for describing the structure of an outer peripheral region of the semiconductor device.

FIG. 5 is a schematic sectional view for describing the structure of the outer peripheral region 15 of the semiconductor device 1. The cross-sectional structure of the outer peripheral region 15 of the semiconductor device 1 shall now be described with reference to FIG. 5. In FIG. 5, the arrangement necessary for describing the outer peripheral region 15 is mainly shown and the arrangement described already with FIG. 1 to FIG. 4 is partially omitted.

As shown in FIG. 5, in addition to the active region 14 and the outer peripheral region 15, a scribe region 46, surrounding the outer peripheral region 15, is formed in the semiconductor layer 2. The front surface protection film 45 is formed to cover the active region 14 and the outer peripheral region 15 and on the other hand expose the scribe region 46. As shown in FIG. 1 and FIG. 2, the emitter pad openings 13, exposing portions of the emitter electrode 3 as pads, are formed in the front surface protection film 45.

In the outer peripheral region 15, a p type well 47 and p type FLRs (Field Limiting Rings) 48 are formed at a front surface portion of the semiconductor layer 2.

A plurality of the p type FLRs 48 are formed so as to surround the p type well 47. In the present preferred embodiment, the p type FLRs 48 include four p type FLRs 48A to 48D successively from the side close to the p type well 47 to the side away therefrom. Intervals W1 to W4 of mutually adjacent p type FLRs 48 (the interval with respect to the p type well 47 in the case of the p type FLR 48 at the innermost side) widen successively from the side close to the p type well 47 to the side away therefrom. For example, the intervals may be such that approximately the interval W1=15 μm, the interval W2=17 μm, the interval W3=19 μm, and the interval W4=23 μm.

Also, in the outer peripheral region 15, an n+ type channel stop region 49 is further formed in the front surface portion of the semiconductor layer 2. The n+ type channel stop region 49 may be formed to reach an end surface 50 of the semiconductor layer 2 from the outer peripheral region 15.

The interlayer insulating film 38 has contact holes 51, selectively exposing the p type FLRs 48, and an outer peripheral removed region 52, selectively exposing the n+ type channel stop region 49.

The electrode film 5 on the interlayer insulating film 38 includes, in addition to the emitter electrode 3 and the gate electrode 4 described above, field plates 53 and an EQR (EQui-Potential Ring) electrode 54.

One field plate 53 is formed for each of the p type FLRs 48A to 48D. The respective field plates 53 are respectively connected to the p type FLRs 48A to 48D inside the contact holes 51 of the interlayer insulating film 38. The field plate 53 connected to the p type FLR 48D at the outermost side has a lead-out portion 55 lead out, on the interlayer insulating film 38, toward the end surface 50 side. A length of the lead-out portion 55 may, for example, be approximately 50 μm.

The EQR electrode 54 is connected to the n+ type channel stop region 49 inside the outer peripheral removed region 52 of the interlayer insulating film 38. Also, a distance L (insulation distance) between an inner peripheral edge of the EQR electrode 54 and an outer peripheral edge of the outermost field plate 53 may, for example, be 30 μm to 60 μm.

Figure 6:
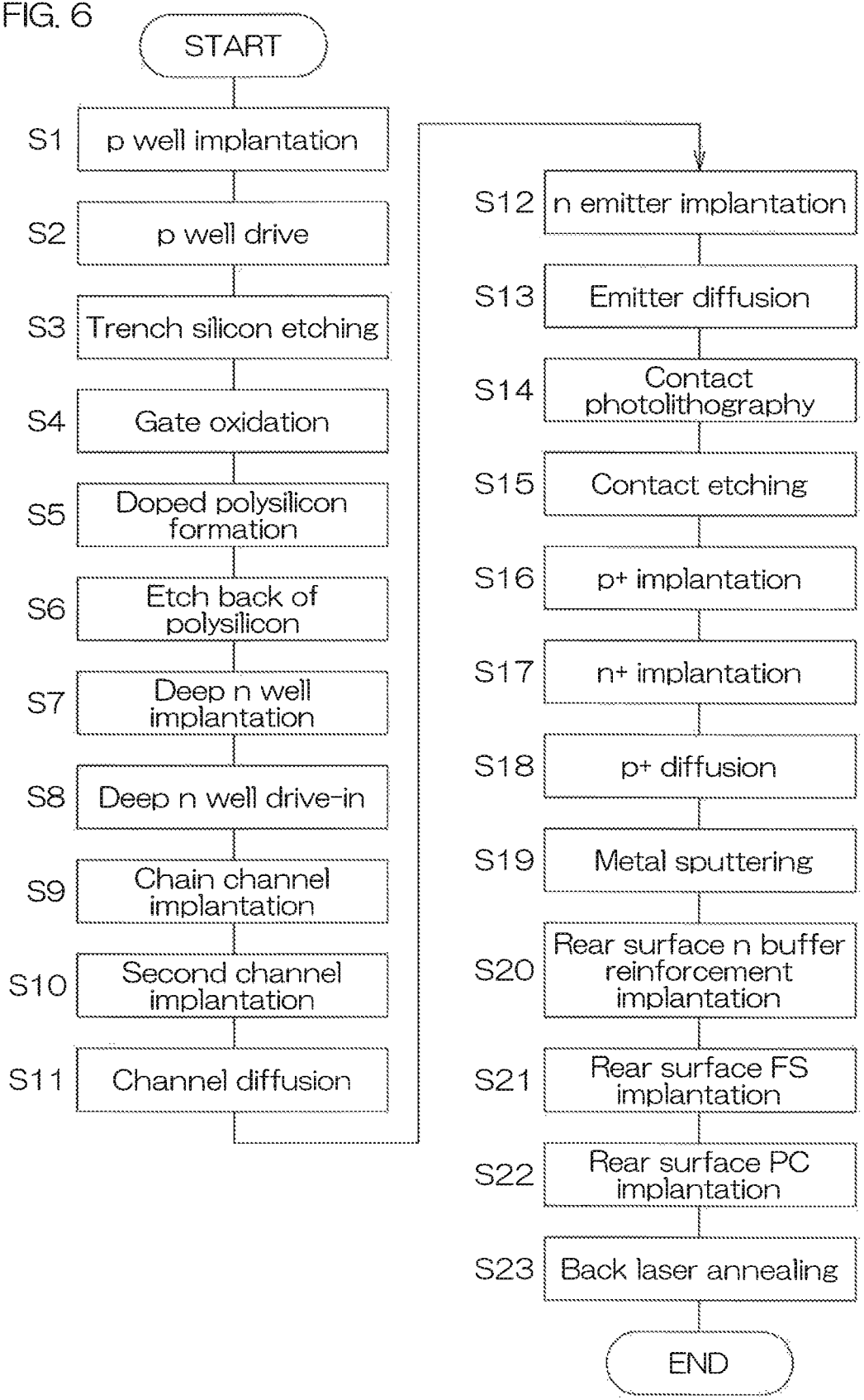
FIG. 6 is a flow diagram for describing a method for manufacturing the semiconductor device.

FIG. 6 is a flow diagram for describing a method for manufacturing the semiconductor device 1. FIG. 6 shows only the main processes in the manufacturing process for the semiconductor device 1 and the manufacturing process for the semiconductor device 1 may include auxiliary processes not shown in FIG. 6.

To manufacture the semiconductor device 1, first, the semiconductor layer 2, formed using a semiconductor wafer of an n− type silicon monocrystal manufactured by an FZ method, is prepared.

Next, ions of a p type impurity (for example, boron) are implanted selectively into the semiconductor layer 2 (step S1), and after the implantation, the semiconductor layer 2 is heat treated (subject to drive-in diffusion) (step S2). The p type well 47 and the p type FLRs 48 are thereby formed in the outer peripheral region 15 of the semiconductor layer 2.

Next, the semiconductor layer 2 is selectively etched to form the gate trenches 16 in the semiconductor layer 2 (step S3).

Next, the gate insulating films 24 (gate oxide films) are formed on the inner walls of the gate trenches 16 by, for example, a thermal oxidation treatment (step S4).

Next, the material of the polysilicon gates 25 is deposited while introducing an impurity by, for example, a CVD method (step S5). The deposition of the material of the polysilicon gates 25 is continued until the gate trenches 16 are refilled and further until the front surface of the semiconductor layer 2 is hidden.

Next, excess portions of the material of the polysilicon gates 25 are removed, for example, by etch back (step S6). That is, the material outside the gate trenches 16 is removed selectively.

Next, ions of an n type impurity (for example, phosphorus) are implanted selectively into the semiconductor layer 2 (step S7), and after the implantation, the semiconductor layer 2 is heat treated (subject to drive-in diffusion) (step S8). The second drift regions 37 (n type wells) are thereby formed in the semiconductor layer 2. By the forming of the second drift regions 37, a region of the semiconductor layer 2 further to the rear surface side than the second drift regions 37 is separated as the first drift region 36.

Next, as shown in FIG. 7A, ions of a p type impurity (for example, boron) are implanted selectively into the semiconductor layer 2 to form the p type channel regions 21 (step S9). The ion implantation is performed with energy being lowered stepwise, for example, by performing the implantation at an angle (for example, of approximately 4° to 8°) with respect to the direction of the normal to the major surface of the semiconductor layer 2. For example, as a first step, implantation is performed at an energy of 500 keV to 700 keV, and next, as a second step, implantation is performed at an energy of 200 keV to 400 keV. Next, to set a gate threshold voltage, ions of the p type impurity are implanted at an even lower energy (for example, at approximately 100 keV to 150 keV) (step S10). Next, the semiconductor layer 2 is heat treated (subject to drive-in diffusion) to form the p type channel regions 21 in the semiconductor layer 2 (step S11).

Figure 7B:
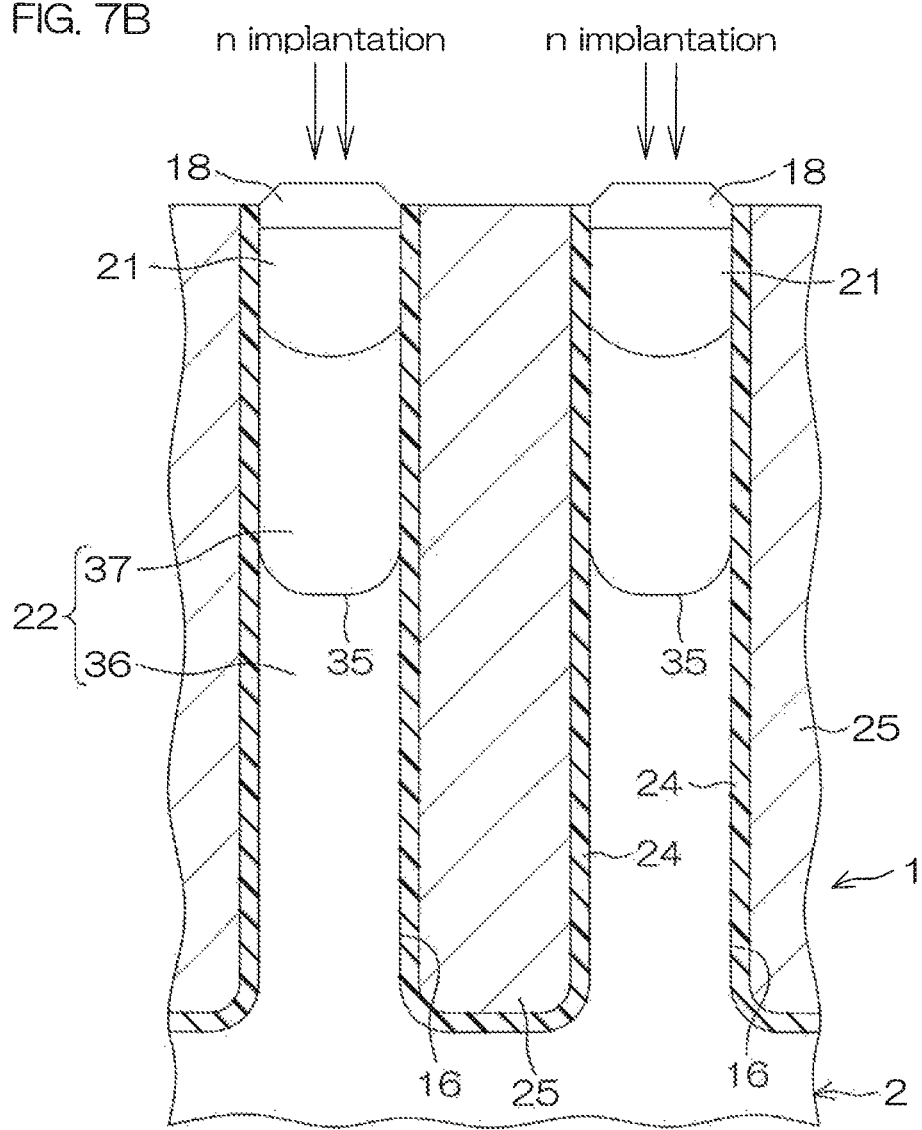

Next, as shown in FIG. 7B, ions of an n type impurity (for example, phosphorus) are implanted selectively into the semiconductor layer 2 (step S12), and after the implantation, the semiconductor layer 2 is heat treated (subject to drive-in diffusion) (step S13). The n$^+$ type emitter regions 18 are thereby formed in the semiconductor layer 2.

Next, as shown in FIG. 7C, a mask 56, constituted, for example, of silicon oxide, is formed on the semiconductor layer 2 (step S14) and the semiconductor layer 2 is dry-etched selectively via the mask 56 (step S15). The contact trenches 20, penetrating through the n$^+$ type emitter regions 18 and reaching the p type channel regions 21, are thereby formed.

Figure 7D:
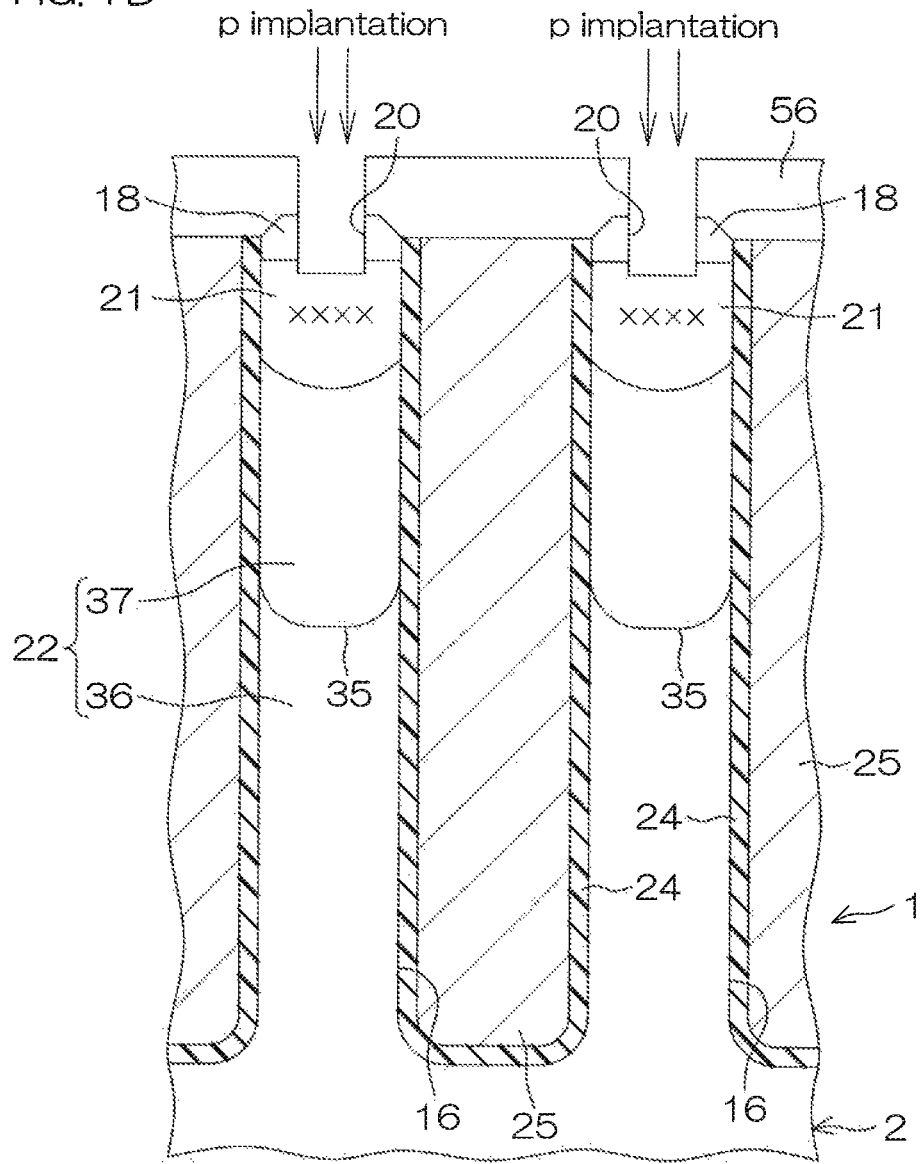

The next process is a process of forming the p$^+$ type channel contact regions 19 and the n$^+$ type convex regions 29 (steps S16 to S18). First, as shown in FIG. 7D, ions of a p type impurity (for example, boron) are implanted selectively at a first energy into the semiconductor layer 2 via the mask 56. The first energy may, for example, be 60 keV to 80 keV. The ions of the p type impurity are thereby implanted to a depth position of "×" in FIG. 7D.

Figure 7E:
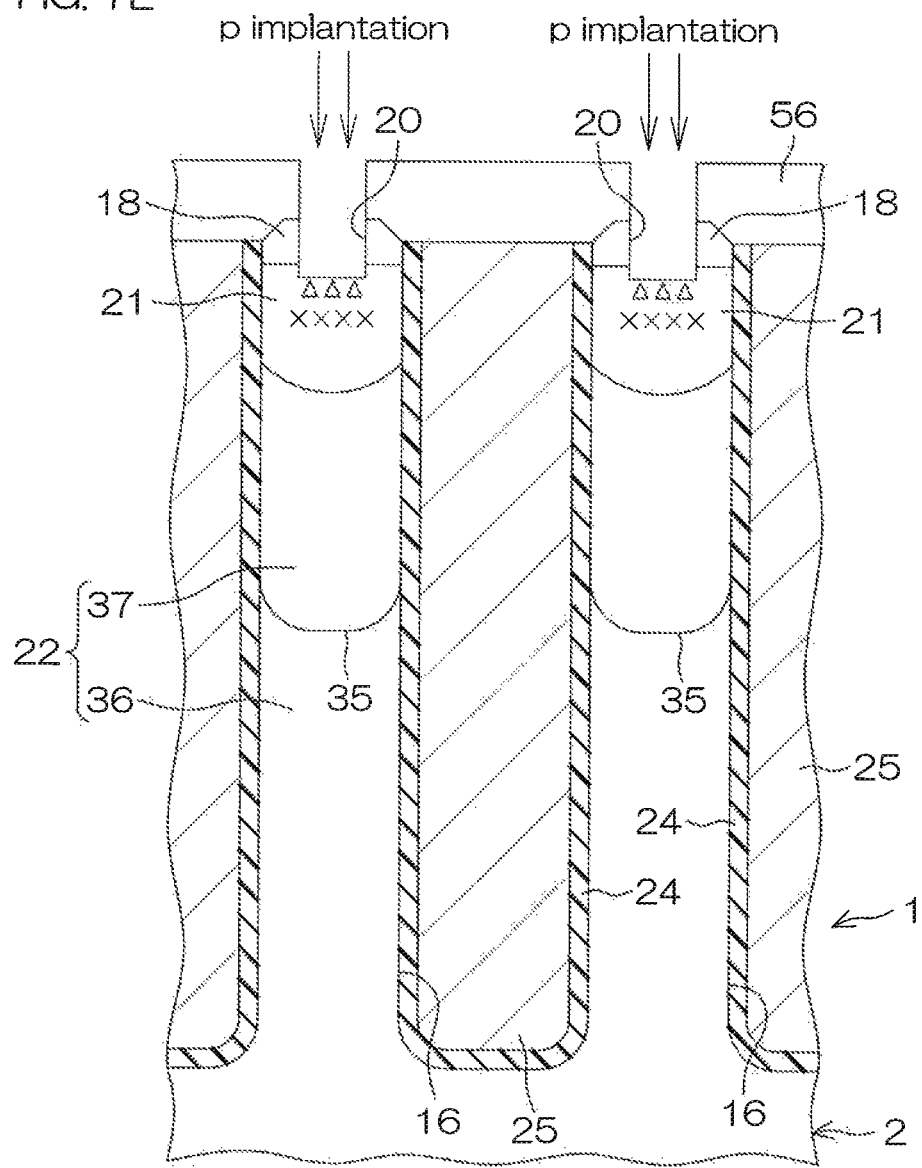

Next, as shown in FIG. 7E, ions of a p type impurity (for example, boron) are implanted selectively at a second energy into the semiconductor layer 2 via the mask 56. The second energy is lower than the first energy and may, for example, be 10 keV to 30 keV. That is, in the process shown in FIG. 7E, the ions of the p type impurity are implanted to "Δ" portions that are shallower than the depth position of "×" to which implantation was performed in FIG. 7D.

Next, as shown in FIG. 7F, ions of an n type impurity (for example, phosphorus) are implanted selectively at a third energy into the semiconductor layer 2 via the mask 56. The third energy is higher than the first energy and may, for example, be 90 keV to 110 keV. That is, in the process shown in FIG. 7F, the ions of the n type impurity are implanted to "□" portions that are deeper than the depth position of "×" to which implantation was performed in FIG. 7D.

Figure 7G:
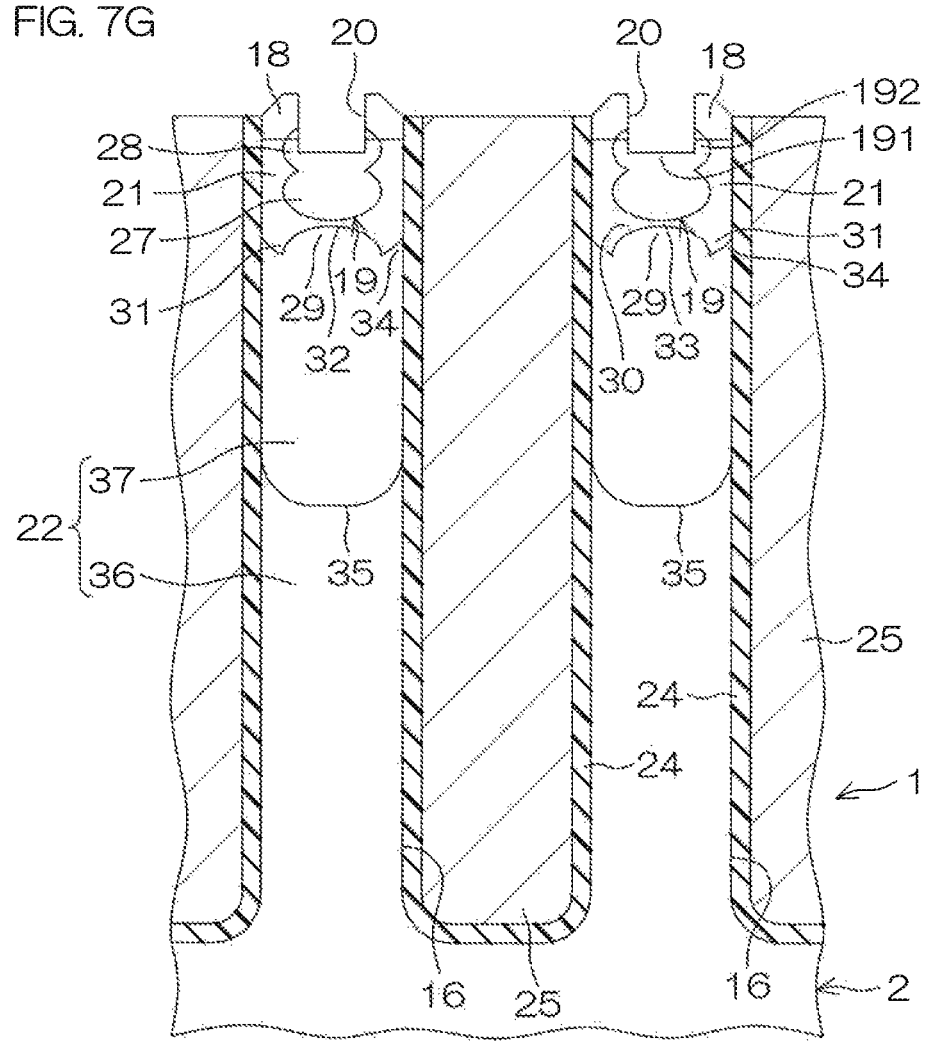

Next as shown in FIG. 7G, the semiconductor layer 2 is heat treated (subject to drive-in diffusion). The p$^+$ type channel contact regions 19 (the first contact regions 27 and the second contact regions 28) and the n$^+$ type convex regions 29 are thereby formed directly below the contact trenches 20 of the semiconductor layer 2 so as to be aligned along the depth direction of the gate trenches 16.

Next, the emitter electrode 3 (electrode film 5) is formed on the semiconductor layer 2, for example, by a sputtering method (step S19).

Next, into the rear surface of the semiconductor layer 2, ions of an n type impurity (for example, phosphorus) are implanted (steps S20 and S21) and further, ions of a p type impurity (for example, boron) are implanted (step S22).

Next, the semiconductor layer 2 is subject to laser annealing processing to form the n type semiconductor region 23 and the p$^+$ type collector region 7 at the semiconductor layer 2 rear surface side (step S23).

Thereafter, the collector electrode 6, etc., are formed and the semiconductor device 1 described above is thereby obtained.

When the semiconductor device 1 is used, a voltage such that the emitter electrode 3 side becomes positive is applied to the emitter electrode 3 and the collector electrode 6. When in this state, the voltage becomes higher than a voltage (gate-emitter voltage) across the gate electrode 4 and the emitter electrode 3 and an on state is entered, n type channels are formed in the p type channel regions 21 (side portions 31) at the side surfaces of the gate trenches 16 and the n$^+$ type emitter regions 18 and the n$^-$ type drift region 22 become electrically continuous. Electrons are thereby supplied to the n$^-$ type drift region 22. These electrons act as a base current of a pnp transistor constituted of the p type channel regions 21, the n$^-$ type drift region 22, and the p$^+$ type collector region 7 and the pnp transistor becomes electrically continuous. Electrons are supplied from the n$^+$ type emitter regions 18, positive holes are implanted from the p$^+$ type collector region 7, and therefore an excess of electrons and positive holes accumulates in the n$^-$ type drift region 22. Conductivity modulation thus occurs in the n$^-$ type drift region 22 and the n$^-$ type drift region 22 transitions to a high conductivity state. Operation of the semiconductor device 1 (IGBT) is thus realized.

Thus with the semiconductor device according to the present preferred embodiment, the n$^+$ type convex regions 29 are formed at top portions of the n$^-$ type drift region 22 and therefore a distance between the n$^+$ type emitter regions 18 and the n$^-$ type drift region 22 that face each other across the p type channel regions 21 can be shortened. A serial resistance component when supplying electrons from the n$^+$ type emitter regions 18 to the n$^-$ type drift region 22 can thereby be reduced and the conductivity modulation in the IGBT can thereby be made to occur efficiently. Consequently, reduction of On-voltage can be achieved. Moreover, the n$^+$ type convex regions 29 are higher in concentration than the n$^-$ type drift region 22 and therefore efficiency of accumulation of positive holes can be improved and the efficiency of conductivity modulation can be improved further.

Also, the n$^+$ type convex regions 29 are formed so as to avoid the side surfaces of the gate trenches 16 at which the channels are formed during the operation of the IGBT and the channel length in the p type channel regions 21 are secured to be of sufficient length by the side portions 31. Therefore, when the IGBT transitions to an off state, the positive holes, which are the minority carriers inside the n$^-$ type drift region 22, can be suppressed from being absorbed by the n$^+$ type emitter regions 18. Consequently, occurrence of latch-up can be suppressed.

Thus with the present semiconductor device 1, the above-described suppression of latch-up and reduction of On-voltage can both be achieved without increasing switching loss.

In regard to the effects described above, whether or not the On-voltage can be reduced and whether or not increase of switching loss can be suppressed by the structure of the semiconductor device 1 shall now be described by way of the following simulations.

<Simulation Nos. 1 to 4>

Figure 8A:
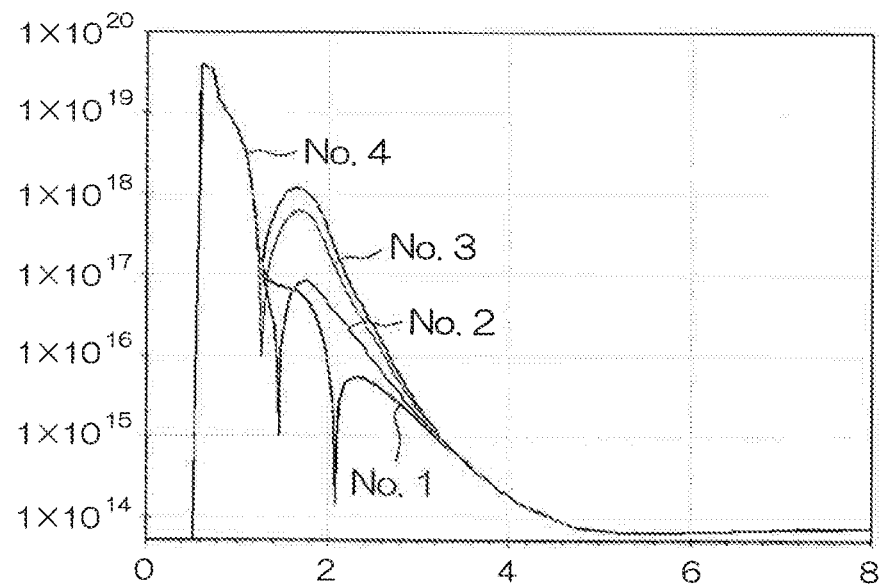
FIG. 8A shows impurity concentration profiles of respective simulation samples and shows data measured along line A-A of FIG. 4.
Figure 8B:
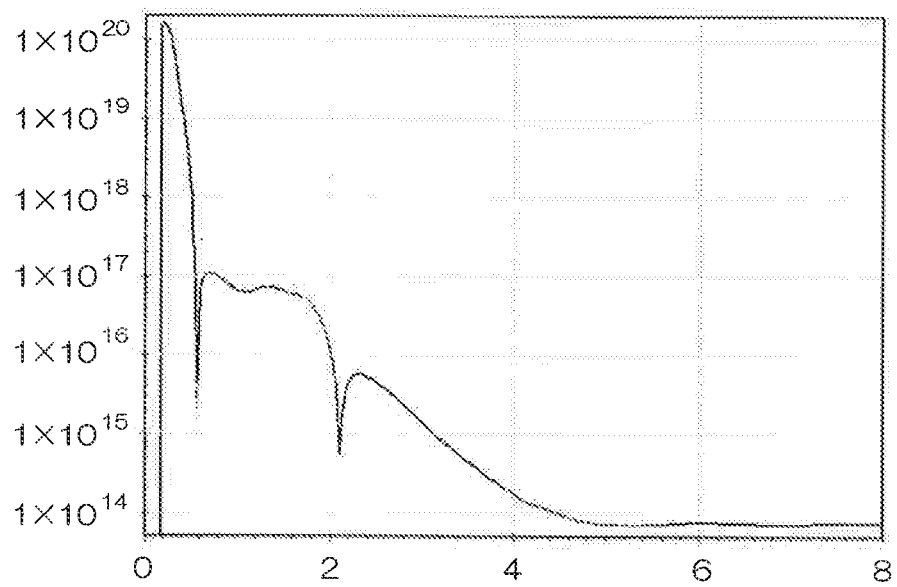
FIG. 8B shows impurity concentration profiles of the respective simulation samples and shows data measured along line B-B of FIG. 4.

First, simulations were performed in regard to structures set with the same conditions except for being made different in the impurity concentration of the n$^+$ type convex regions 29 in the semiconductor device 1 described above. A total of four simulation sample Nos. 1 to 4 were tested. The conditions of the respective simulation samples are as shown below. Also, concentration profiles, including the impurity concentration of the n$^+$ type convex regions 29, in the depth direction of the semiconductor layer 2 are shown in FIG. 8A and FIG. 8B. FIG. 8A and FIG. 8B show profiles measured along line A-A and line B-B, respectively, of FIG. 4. Also in FIG. 8A and FIG. 8B, the X-axis origin is the position of the front surface of the semiconductor layer 2 and the positive side of the X-axis is the depth direction of the gate trench 16. The profile of FIG. 8B is substantially the same for all of samples Nos. 1 to 4.

Sample No. 1: concentration of the n$^+$ type convex regions 29=0 (no n$^+$ type convex region 29)

Figure 9A:
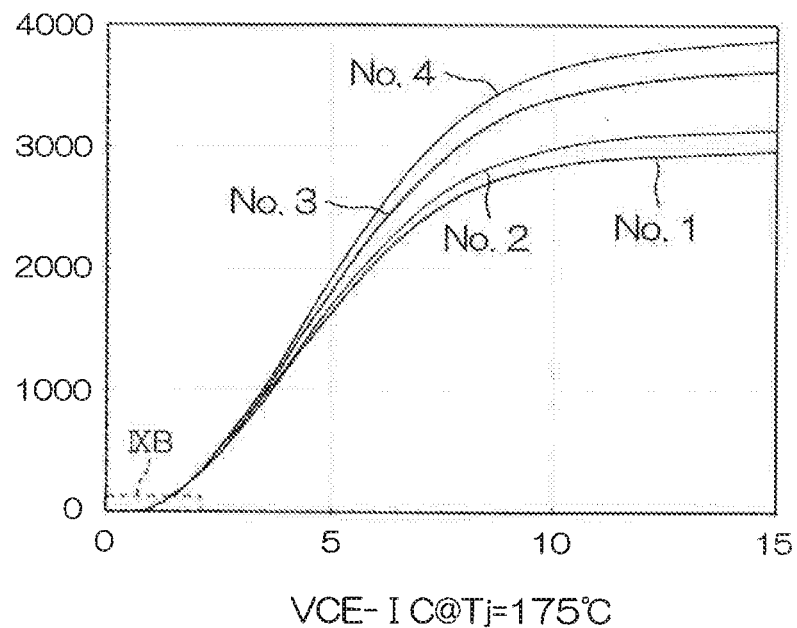
FIG. 9A is a diagram showing $V_{ce}$-$I_c$ characteristics of the respective simulation samples.
Figure 9B:
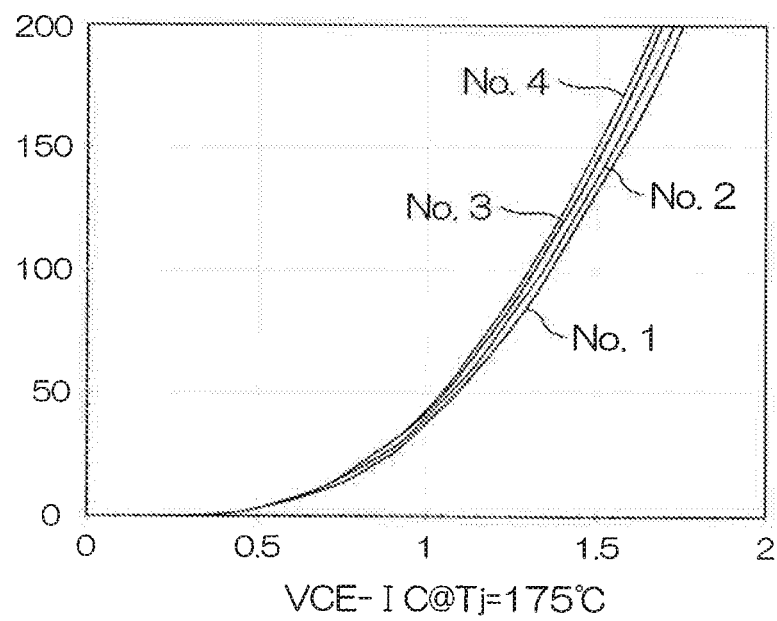
FIG. 9B is an enlarged view of a region surrounded by broken lines IXB of FIG. 9A.

Sample No. 2: concentration of the n$^+$ type convex regions 29=1.0×10$^{13}$ cm$^{-3}$ Sample No. 3: concentration of the n$^+$ type convex regions 29=5.0×10$^{13}$ cm$^{-3}$ Sample No. 4: concentration of the n$^+$ type convex regions 29=1.0×10$^{14}$ cm$^{-3}$ Respective V$_{ce}$-I$_c$ characteristics of the sample Nos. 1 to 4 where then measured with the conditions of junction temperature Tj=175° C., active size=10 mm-square, and gate-emitter voltage V$_{ge}$=15V being set. The results are shown in FIG. 9A and FIG. 9B. FIG. 9B is an enlarged view of a region surrounded by broken lines IXB of FIG. 9A.

As is clear from FIG. 9A and FIG. 9B, in comparison to sample No. 1, which does not have the n$^+$ type convex region 29, it was possible to reduce the On-voltage with sample Nos. 2 to 4, which have the n$^+$ type convex regions 29. It was also possible to confirm that the higher the impurity concentration of the n$^+$ type convex region 29, the greater the amount of reduction of the On-voltage.

Figure 10A:
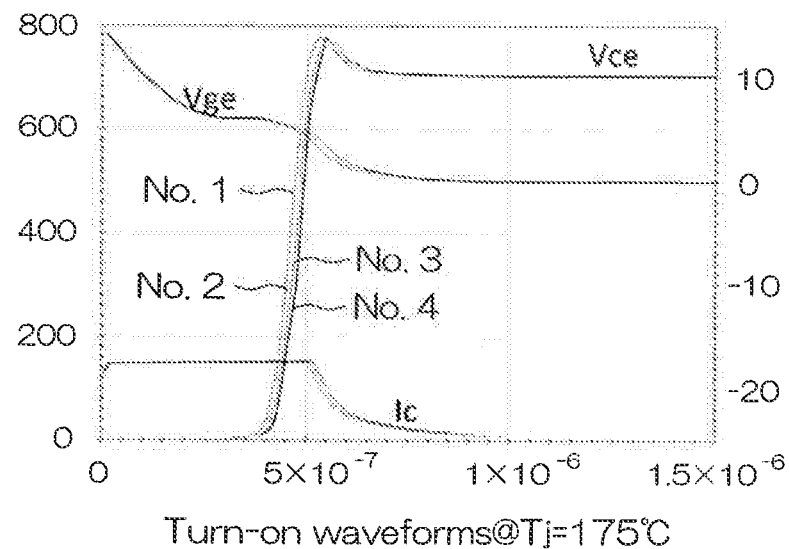
FIG. 10A is a diagram of turn-on waveforms of the respective simulation samples.
Figure 10B:
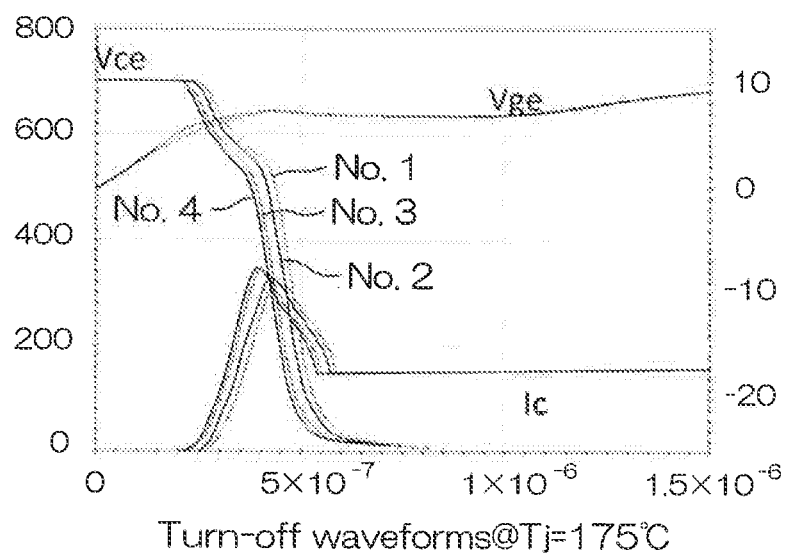
FIG. 10B is a diagram of turn-off waveforms of the respective simulation samples.

Further, respective turn-on waveforms and turn-off waveforms of sample Nos. 1 to 4 under the same measurement conditions are as shown in FIG. 10A and FIG. 10B. The results of Table 1 were obtained by determining, from the waveforms obtained, a turn-on loss E$_{on}$, a turn-on loss E$_{off}$, and a total loss E$_{total}$ (E$_{on}$+E$_{off}$) of each simulation sample.

TABLE 1

| No. | Eon (mJ) | Eoff (mJ) | Etotal (mJ) |
|---|---|---|---|
| 1 | 24.1 | 19.9 | 44 |
| 2 | 24.1 | 20.2 | 44.3 |
| 3 | 23.5 | 20.1 | 43.6 |
| 4 | 23.3 | 20.2 | 43.5 |

Table 1 shows that in regard to switching loss, there was no simulation sample that has superiority over the other samples. That is, in consideration of the results of FIG. 9A and FIG. 9B, it was possible to reduce the On-voltage without accompanying increase of switching loss with sample Nos. 2 to 4. This effect is illustrated in FIG. 11.

Figure 11:
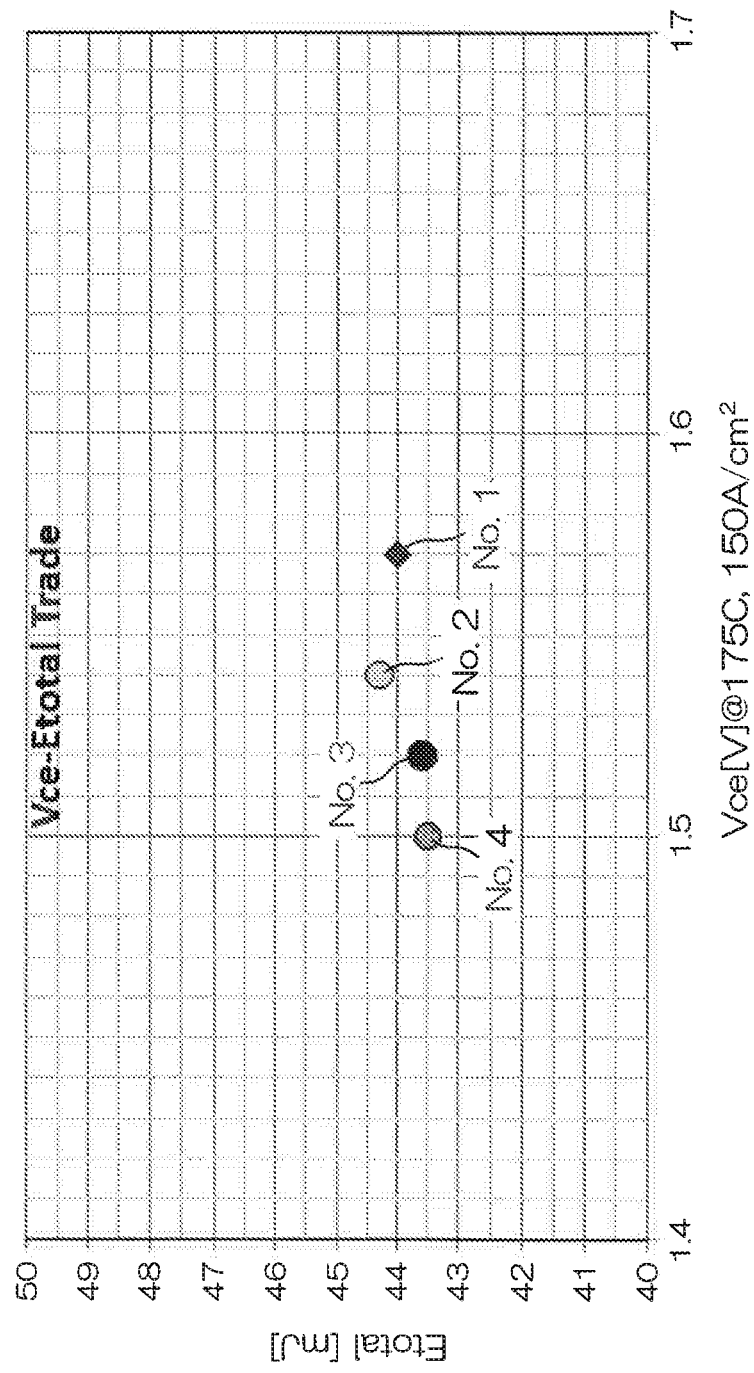
FIG. 11 is a diagram of relationships of $V_{ce}$ and $E_{total}$ of the respective simulation samples.

Referring to FIG. 11, it can be understood that despite the switching loss (E$_{total}$), indicated by the Y-axis, being substantially fixed, it was possible for the On-voltage V$_{ce}$ of each of sample Nos. 2 to 4 to be reduced in comparison to that of sample No. 1.

Although a preferred embodiment of the present invention has been described above, the present invention may also be implemented in yet other modes.

For example, an arrangement in which the conductivity types of the respective semiconductor portions of the semiconductor device 1 are inverted may be adopted. For example, in the semiconductor device 1, a p type portion may be of an n type and an n type portion may be of a p type.

Also, although with the preferred embodiment described above, a semiconductor wafer of an n$^-$ type silicon monocrystal manufactured by the FZ method was indicated as an example of the semiconductor layer 2, the semiconductor layer 2 may instead be a silicon epitaxial substrate having an epitaxial layer formed on its front surface.

The semiconductor device of the present invention may be incorporated, for example, in a power module used in an inverter circuit that constitutes a driving circuit arranged to drive an electric motor used as a power source of an electric vehicle (including a hybrid vehicle), an electric train, an industrial robot, etc. It may also be incorporated in a power module used in an inverter circuit that converts electric power, generated by a solar cell, a wind power generator, or other power generating apparatus (especially an independent power generating apparatus), so as to match the electric power of a commercial power source.

Besides the above, various design modifications may be made within the scope of the matters described in the claims.

What is claimed is:

1. A semiconductor device comprising:
   a semiconductor layer;
   a trench formed in the semiconductor layer;
   a contact portion arranged around the trench, an electrode connected to the contact portion;
   a gate electrode embedded in the trench through an insulating film;
   a drift region of a first conductivity type formed in the semiconductor layer, the drift region extending along a side surface of the trench;
   an impurity region of the first conductivity type having an impurity concentration higher than an impurity concentration of the drift region, the impurity region arranged below the contact portion, and the impurity region being continuous with the drift region; and
   a channel region of a second conductivity type, arranged at a front surface portion of the semiconductor layer, wherein the impurity region is away from the side surface of the trench, the channel region extends toward a rear surface side of the drift region with increasing distance from the trench, and the extension of the channel region is decreased at a region beyond a predetermined position from the trench.

2. The semiconductor device according to claim 1, wherein the drift region includes a first drift region, and a second drift region arranged between the first drift region and the impurity region and having an impurity concentration higher than an impurity concentration of the first drift region, and the impurity region is continuous with the second drift region.

3. The semiconductor device according to claim 1, further comprising:

an emitter region of the first conductivity type, arranged at a front surface portion of the channel region; and a collector region of the second conductivity type, arranged in the semiconductor layer at a rear surface side of the drift region; wherein the contact portion includes a channel contact region of the second conductivity type, arranged in the channel region.

4. The semiconductor device according to claim 3, wherein the first conductivity type impurity concentration of the impurity region is higher than the second conductivity type impurity concentration of the channel region.

5. The semiconductor device according to claim 4, wherein the second conductivity type impurity concentration of the channel region is $5 \times 10^{15}$ cm$^{-3}$ to $5 \times 10^{17}$ cm$^{-3}$ and the first conductivity type impurity concentration of the impurity region is $5 \times 10^{15}$ cm$^{-3}$ to $1 \times 10^{18}$ cm$^{-3}$.

6. The semiconductor device according to claim 1, wherein the first conductivity type impurity concentration of the drift region is $4 \times 10^{13}$ cm$^{-3}$ to $1 \times 10^{15}$ cm$^{-3}$ and the first conductivity type impurity concentration of the impurity region is $5 \times 10^{15}$ cm$^{-3}$ to $1 \times 10^{18}$ cm$^{-3}$.

7. The semiconductor device according to claim 3, further comprising: a contact trench, reaching the channel region from the front surface of the semiconductor layer through the emitter region, wherein the channel contact region is arranged at a bottom portion of the contact trench, and the impurity region is arranged at a position deeper than the channel contact region and faces the channel contact region.

8. The semiconductor device according to claim 7, wherein the impurity region faces the channel contact region across a portion of the channel region.

9. The semiconductor device according to claim 7, wherein the channel contact region has a two-step structure of a first contact region, arranged at a side close to the impurity region, and a second contact region, arranged on the first contact region and being of lower concentration than the first contact region, and the second contact region forms the bottom portion of the contact trench.

10. The semiconductor device according to claim 1, wherein the semiconductor layer is made of a silicon substrate.

11. The semiconductor device according to claim 3, further comprising: an emitter electrode, electrically connected to the emitter region; and a collector electrode, electrically connected to the collector region.

12. The semiconductor device according to claim 1, wherein the impurity region is arranged at a closer level to a front surface of the semiconductor layer than a bottom portion of the trench in a depth direction of the trench.

13. The semiconductor device according to claim 1, wherein the impurity region is arranged between a pair of trenches.

14. The semiconductor device according to claim 1, wherein an extension portion of the channel region is separated from the trench by a gap.

* * * * *